United States Patent
Gilbert

(10) Patent No.: US 9,374,055 B2
(45) Date of Patent: Jun. 21, 2016

(54) HYBRID TRANSLINEAR AMPLIFIER

(71) Applicant: Analog Devices, Inc., Norwood, MA (US)

(72) Inventor: Barrie Gilbert, Beaverton, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/192,601

(22) Filed: Feb. 27, 2014

(65) Prior Publication Data
US 2015/0381128 A1    Dec. 31, 2015

(51) Int. Cl.
| | |
|---|---|
| *H03F 3/04* | (2006.01) |
| *H03F 3/45* | (2006.01) |
| *H03F 3/30* | (2006.01) |
| *H03G 3/00* | (2006.01) |
| *H03F 1/26* | (2006.01) |

(52) U.S. Cl.
CPC ............ *H03G 3/007* (2013.01); *H03F 1/26* (2013.01); *H03F 3/04* (2013.01); *H03F 3/45085* (2013.01); *H03F 3/45089* (2013.01); *H03F 2200/171* (2013.01); *H03F 2200/261* (2013.01); *H03F 2203/45392* (2013.01)

(58) Field of Classification Search
USPC ......................................... 330/252–261, 278
See application file for complete search history.

(56) References Cited

U.S. PATENT DOCUMENTS

| | | | |
|---|---|---|---|
| 4,523,109 A | 6/1985 | van Roessel et al. | |
| 4,605,906 A * | 8/1986 | Miller ................... | H03F 1/3211 330/149 |
| 5,039,952 A * | 8/1991 | Dreps .................. | H03G 3/3084 330/252 |
| 5,432,474 A | 7/1995 | Lauffenburger et al. | |
| 6,842,071 B1 | 1/2005 | Retz et al. | |
| 7,545,834 B1 * | 6/2009 | Guo ....................... | H03F 3/211 327/407 |
| 2004/0104775 A1 | 6/2004 | Seremeta | |
| 2008/0246537 A1 | 10/2008 | Aziz | |
| 2010/0329304 A1 | 12/2010 | Doorenbos | |
| 2011/0043284 A1 | 2/2011 | Zhao et al. | |

OTHER PUBLICATIONS

International Search Report and Written Opinion, PCT/US2015/17661, May 29, 2015, 10 pages.

\* cited by examiner

*Primary Examiner* — Hieu Nguyen
(74) *Attorney, Agent, or Firm* — Patent Capital Group

(57) ABSTRACT

A hybrid, translinear amplifier has at least one gain stage including first and second gain transistors, at least a first load transistor electrically coupled to the first gain transistor and at least a second load transistor electrically coupled to the second gain transistor, and load resistors electrically coupled to the load transistors. A hybrid, translinear amplifier with selectable gain has a first hybrid, translinear amplifier cell having at least first and second load transistors, each load transistor having a load resistor, at least one additional hybrid, translinear amplifier cell having at least third, fourth, fifth and sixth load transistors, each load transistor having a load resistor, at least two switches electrically coupled to the amplifier cells to allow selection of one of the amplifier cells, and a differential output signal having a gain corresponding to a selected amplifier cell.

28 Claims, 4 Drawing Sheets

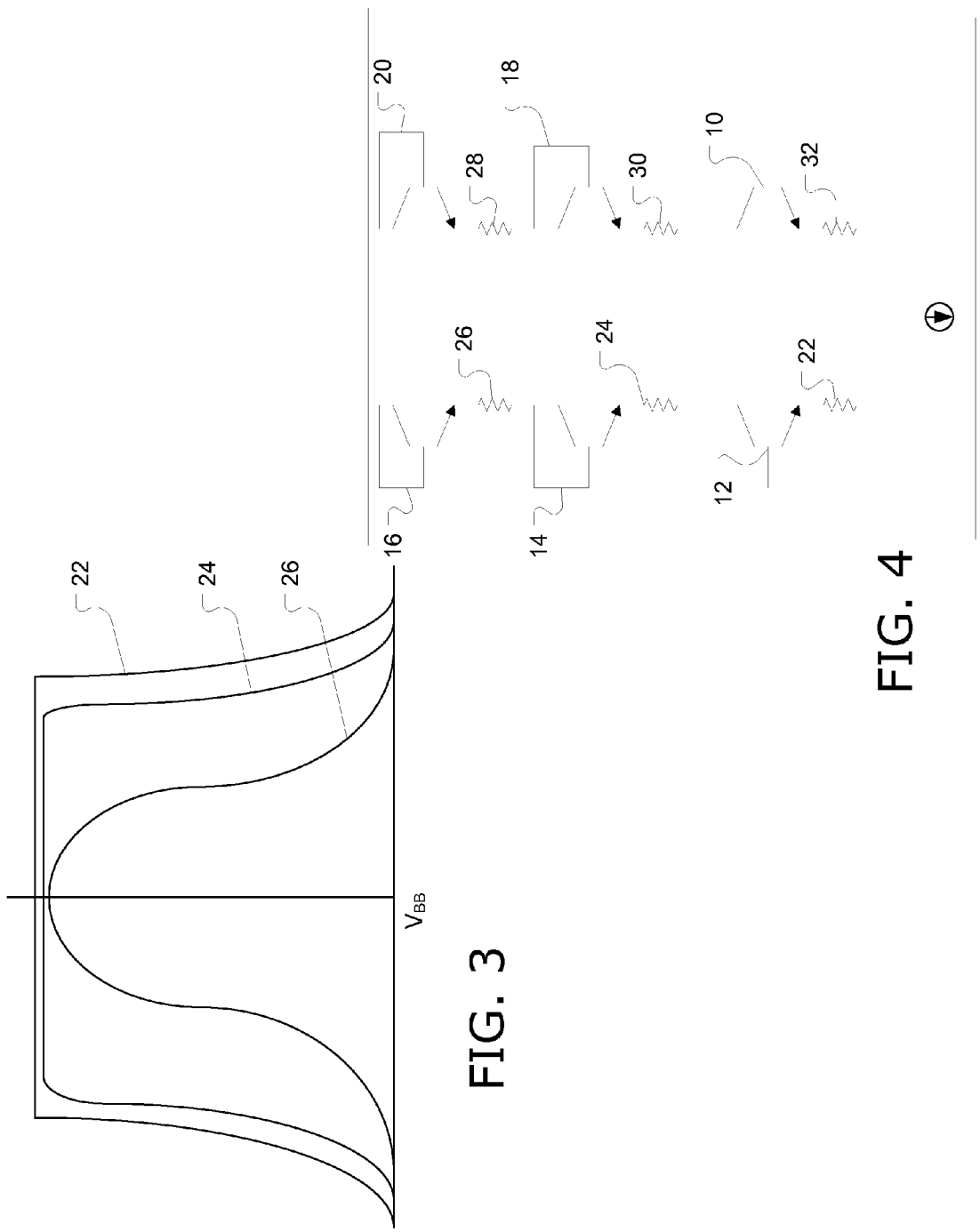

HYBRID TRANSLINEAR AMPLIFIER

BACKGROUND

Many measurement instruments receive data in analog form and convert it to digital form for analysis and display using an analog-to-digital converter (ADC). The incoming signals typically need to be amplified and filtered prior to reaching the ADC. Current and past amplifiers have some shortcomings that can be improved.

FIG. 1 shows a prior art gain stage, often referred to as a $g_m$-$R_L$ amplifier having two transistors 10 and 12, referred to here as gain transistors. The gain is proportional to the tail current I, and the gain being equal to the product of the $g_m$ and the $R_L$. Most transistors suffer from a shortcoming in that there is an ohmic resistance associated with the base-emitter loop. There is a resistance from the base to the emitter, including the intrinsic base and a contacting resistance from the intrinsic emitter to the contact. This results in the gain not being exactly what one would expect based upon the current, because these resistances lower it. In addition, the response is non-linear when the input signal swings.

FIG. 2 shows an example of a translinear amplifier having a series of transistors as loads. Transistor 12 has transistors 16 and 14 as loads, and transistor 10 has transistors 18 and 20 as loads. In this example, all of the ohmic components are the same. This results in the gain being 2, referred to as an ×2 amplifier, being a numerical 'times 2' amplification. The gain also does not depend upon the current. For at least a portion of the response of the amplifier in FIG. 2, the response is linear because whatever happens in the gain stage happens in the load as well. However, the increase in $r_e$ means that the currents get lower. As the currents get lower, the bandwidth suffers. The amplifier provides an output to drive the load that will have a capacitive aspect to it. A high $r_e$ which is seen by the transistors when the current goes down results in a non-linear response in the lower current ranges.

It is possible to develop an amplifier that has performance characteristics in between the two types of amplifiers.

BRIEF DESCRIPTION OF THE DRAWINGS

FIG. 3 shows a graphical representation of amplifier response curves.

FIG. 4 shows an embodiment of a hybrid translinear amplifier.

DETAILED DESCRIPTION OF THE EMBODIMENTS

Figure 1:
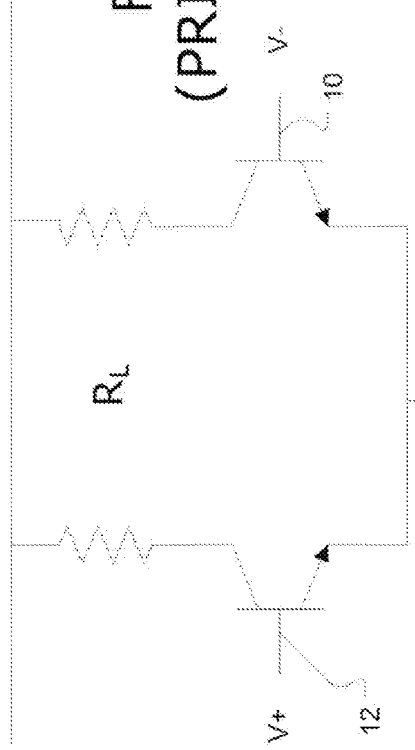
FIGS. 1 and 2 show prior art embodiments of amplifiers.
Figure 2:
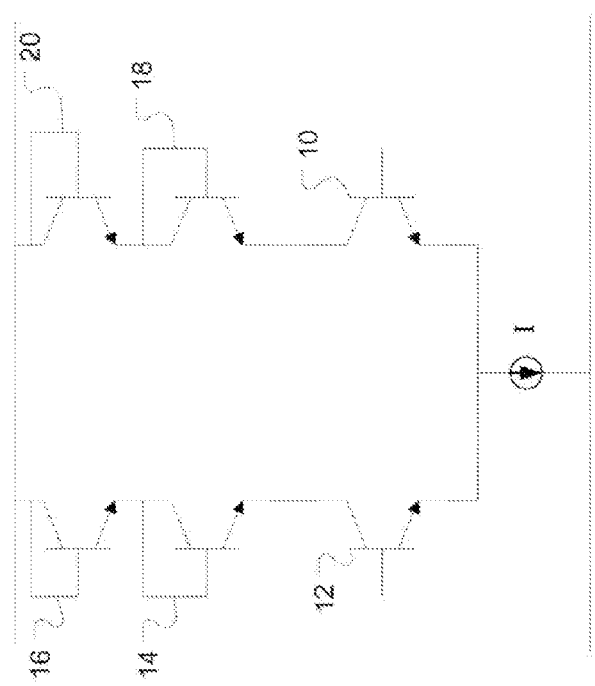

FIG. 4 shows an embodiment of a hybrid translinear amplifier having a wide range of linear response. FIG. 4 shows an amplifier similar to the translinear amplifier of FIG. 2, but having resistors in the loads. Load transistors 14 and 16 have resistors 24 and 26, and load transistors 18 and 20 have resistors 30 and 28. The traditional $g_m$-$R_1$ of FIG. 1 has resistive loads. The addition of the transistors, wired as diodes, in FIG. 2 provided a translinear response. By adding resistors to the loads, the resulting amplifier has a response between a $g_m$-$R_1$ and translinear amplifier, which is referred to here as a 'hybrid' translinear amplifier. Resistors 22 and 32 are added to the transistors of the gain stage, which may also apply to the gain stage of FIG. 1.

The amplifier of FIG. 4 has a more robust high frequency response. FIG. 3 shows a graphical comparison of the responses. In FIG. 3, the outer curve has a DC (direct current or steady-state) response. At high frequencies the current in the load drops, resulting in the inner curve in FIG. 3 showing the non-linearity of the response. The response of the amplifier at the middle frequencies is in the middle curve of FIG. 3.

The amplifier in FIG. 4 has the same resistances to the left and right, and up and down. This causes a reduction of gain in the $g_m$-$R_1$ stage because of the increased resistances over the transistor of FIG. 2, and the recovery of the gain by the inclusion of these resistances, the amplifier sustains the broader range of the linear responses. In one embodiment, the amplifier operates with a linear response up to 4 GHz. Similar to the amplifier of FIG. 2, the amplifier of FIG. 4 is free of the tail current I as a driver of the gain.

Figure 5:
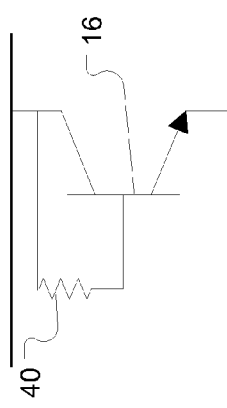
FIG. 5 shows an embodiment of a transistor having a base resistor.

With regard to the load transistors, the current coming out of the base is an increasing function of frequency, one can add a resistor to the base to make the load look inductive. The DC beta, $\beta_{DC}=f_t/f_s$, drops linearly as the frequency decreases. This could be used in the transistors in the $g_m$ cell, but typically the performance of those transistors will suffer if there is an inductive aspect to their configuration. The addition of a base resistor 40 to the base of the load transistor such as 16 is shown in FIG. 5. This addition of inductive peaking increases the range of frequencies for which the amplifier response is linear.

Figure 6:
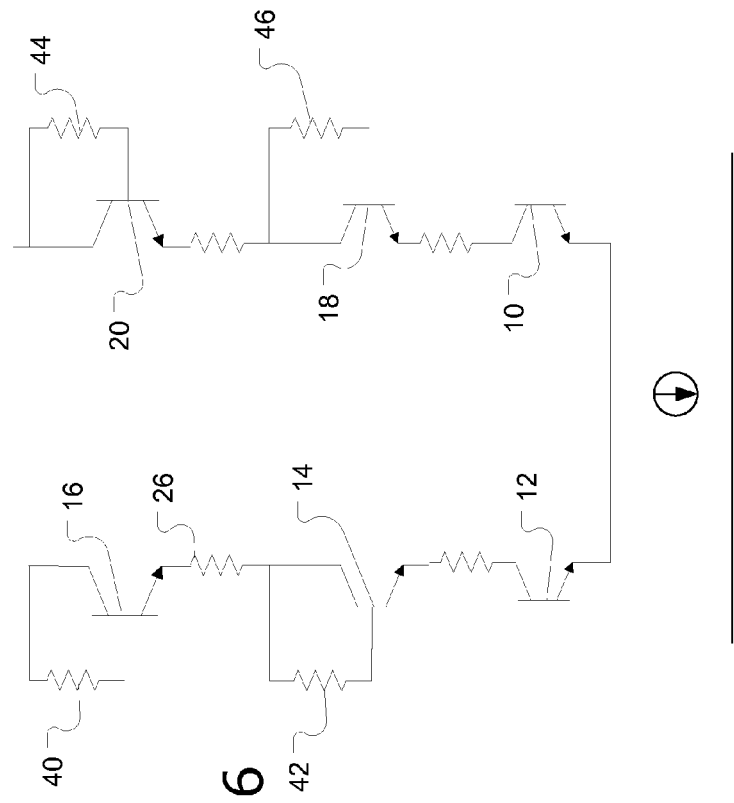
FIG. 6 shows an embodiment of a hybrid translinear amplifier.

FIG. 6 shows an embodiment of an ×2 amplifier having resistive loads with inductive peaking. For example, load transistor 16 has a base resistor 40 and a load resistor 26. This configuration is repeated for the other load transistors 14, 18 and 20. The amplifier of FIG. 6 has a much wider range of linear response than the previous amplifiers.

Figure 7:
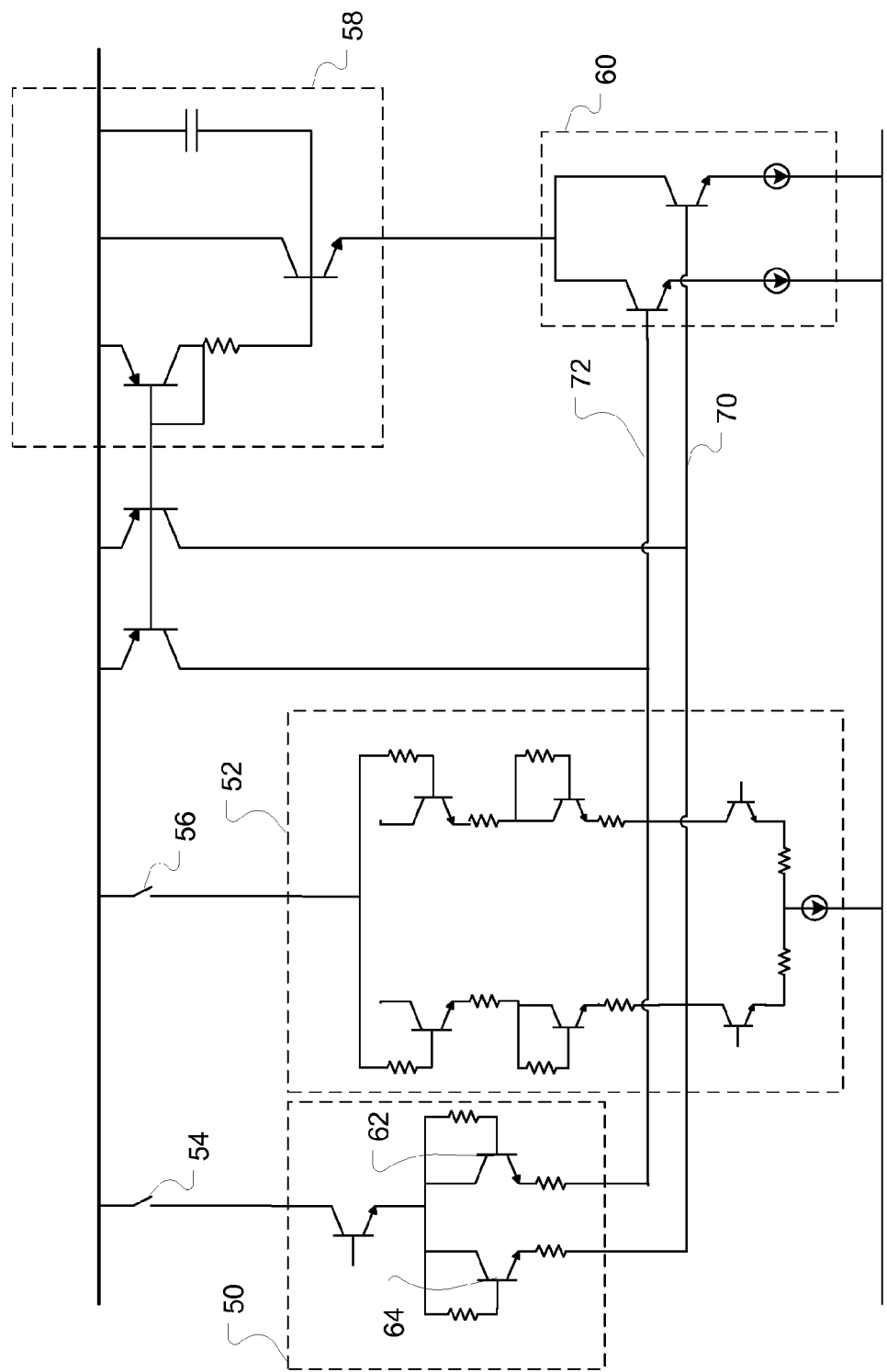
FIG. 7 shows an embodiment of a switchable ×1/×2 amplifier.

FIG. 7 shows an embodiment of a switchable ×1/×2 amplifier. This embodiment makes the gain changeable between integer values. One should note that the integer value depends on the supply voltage. With a high enough supply, the gain could be three, or four, etc. For instrumentation front ends, such as in oscilloscopes, having a switchable gain allows for very small incoming signals that require large gains and for large incoming signals that require little or no gain. The gain switching normally occurs via a control knob of setting on the front panel of the instrument.

In FIG. 7, the switches 54 and 56 allow for selection between the ×2 hybrid translinear amplifier 52 as in FIG. 6, and an ×1 amplifier 50. If switch 54 is closed, the transistors 62 and 64 take the current away from the ×2 amplifier 52 and the resulting outputs 70 and 72 reflect a gain of 1. The resistor-capacitor connections at 58 provide filtering to the outputs. Similarly, the transistors within 60 provide beta current cancellation on the outputs. Typically, the outputs will drive an analog-to-digital converter It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A hybrid, translinear amplifier, comprising:
   at least one gain stage including first and second gain transistors;

at least a first load transistor electrically coupled to the first gain transistor and at least a second load transistor electrically coupled to the second gain transistor;

load resistors electrically coupled to the load transistors; and base resistors electrically coupled to bases of the load transistors.

2. The amplifier of claim 1, further comprising load resistors electrically coupled to emitters of the first and second gain transistors.

3. The amplifier of claim 1, wherein all the base resistors have the same value.

4. The amplifier of claim 1, wherein the response of the amplifier is between a response of a $g_m$-$R_h$ amplifier and a translinear amplifier.

5. The amplifier of claim 1, further comprising a third load transistor electrically coupled to the first gain transistor and a fourth load transistor electrically coupled to the second gain transistor.

6. The amplifier of claim 5, wherein the third and fourth load transistors have load resistors.

7. The amplifier of claim 6, wherein the third and fourth load transistors have base resistors.

8. The amplifier of claim 1, wherein the load resistors have a same resistance.

9. The amplifier of claim 1, wherein the load transistors are wired as diodes.

10. The amplifier of claim 1, wherein the amplifier has a linear response at input signal frequencies up to 4 GHz.

11. A hybrid, translinear amplifier with selectable gain, comprising:

a first hybrid, translinear amplifier cell having at least first and second load transistors, each load transistor having a load resistor;

at least one additional hybrid, translinear amplifier cell having at least third, fourth, fifth and sixth load transistors, each load transistor having a load resistor;

at least two switches electrically coupled to the amplifier cells to allow selection of one of the amplifier cells; and a differential output to generate a differential output signal having a gain corresponding to a selected amplifier cell.

12. The amplifier of claim 11, further comprising a filter circuit electrically coupled to the differential output.

13. The amplifier of claim 12, wherein the filter circuit comprises a resistor and capacitor.

14. The amplifier of claim 11, further comprising a beta current cancellation circuit electrically coupled to the output.

15. The amplifier of claim 11, wherein the first amplifier cell comprises an ×1 amplifier cell.

16. The amplifier of claim 11, wherein the additional amplifier cell comprises an ×2 amplifier cell.

17. The amplifier of claim 11, wherein the amplifier cells provide gain having an integer value.

18. The amplifier of claim 17, wherein the integer value depends upon a supply voltage.

19. A selectable gain amplifier, comprising:

a plurality of translinear amplifier cells, wherein the plurality of translinear amplifier cells includes:

a first translinear amplifier cell having at least first and second load transistors, each load transistor having a load resistor, and a second translinear amplifier cell having at least third, fourth, fifth and sixth load transistors, each load transistor having a load resistor;

at least one switch electrically coupled to the translinear amplifier cells to allow selection of one of the translinear amplifier cells; and an output to generate an output signal having a gain corresponding to a selected translinear amplifier cell.

20. The selectable gain amplifier of claim 19, wherein the first translinear amplifier cell comprises an ×1 amplifier cell.

21. The selectable gain amplifier of claim 20, wherein the second translinear amplifier cell comprises an ×2 amplifier cell.

22. The selectable gain amplifier of claim 19, wherein the selectable gain amplifier provides gain having an integer value.

23. The selectable gain amplifier of claim 22, wherein the integer value depends upon a supply voltage.

24. A method of adjustably amplifying an input signal, comprising:

causing at least one switch in a selectable gain amplifier to select a translinear amplifier cell of a plurality of translinear amplifier cells, wherein a first translinear amplifier cell of the plurality of translinear amplifier cells includes at least first and second load transistors, and each load transistor has a load resistor; and generating an output signal having a gain corresponding to the selected translinear amplifier cell.

25. The method of claim 24, wherein the plurality of translinear amplifier cells includes a second translinear amplifier cell, the second translinear amplifier cell has at least third, fourth, fifth and sixth load transistors, and each load transistor of the second translinear amplifier cell has a load resistor.

26. The method of claim 24, wherein the first translinear amplifier cell includes an ×1 amplifier cell, and a second translinear amplifier cell of the plurality of translinear amplifier cells includes an ×2 amplifier cell.

27. The method of claim 24, wherein causing at least one switch to select a translinear amplifier cell includes causing at least one switch to couple the translinear amplifier cell to a supply voltage.

28. The method of claim 24, wherein the output signal is a differential output signal.

* * * * *